United States Patent
Furukawa et al.

(10) Patent No.: US 9,324,931 B2
(45) Date of Patent: Apr. 26, 2016

(54) PIEZOELECTRIC DEVICE

(71) Applicant: TDK CORPORATION, Tokyo (JP)

(72) Inventors: Masahito Furukawa, Tokyo (JP); Tomohisa Azuma, Tokyo (JP); Taku Masai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 555 days.

(21) Appl. No.: 13/893,865

(22) Filed: May 14, 2013

(65) Prior Publication Data

US 2014/0339962 A1 Nov. 20, 2014

(51) Int. Cl.
| | |
|---|---|
| *H01L 41/187* | (2006.01) |
| *C04B 35/00* | (2006.01) |
| *H01L 41/047* | (2006.01) |
| *H01L 41/08* | (2006.01) |
| *H01L 41/313* | (2013.01) |

(52) U.S. Cl.
CPC ........ *H01L 41/0477* (2013.01); *H01L 41/0815* (2013.01); *H01L 41/1873* (2013.01); *H01L 41/313* (2013.01)

(58) Field of Classification Search
CPC ................................. H01B 3/12; H01G 4/1227
USPC ................... 310/358; 252/62.9; 501/134–138
See application file for complete search history.

(56) References Cited

U.S. PATENT DOCUMENTS

| | | | |
|---|---|---|---|
| 8,183,747 B2 * | 5/2012 | Kawada | ........................ 310/358 |
| 8,446,074 B2 | 5/2013 | Shibata et al. | |
| 2005/0213283 A1 | 9/2005 | Nakano et al. | |
| 2006/0006360 A1 | 1/2006 | Takao et al. | |
| 2006/0091588 A1 | 5/2006 | Nakamura et al. | |
| 2006/0251911 A1 | 11/2006 | Feltz et al. | |
| 2006/0254693 A1 | 11/2006 | Murosawa et al. | |
| 2007/0216264 A1 | 9/2007 | Furukawa et al. | |
| 2007/0228874 A1 | 10/2007 | Nagaya et al. | |
| 2010/0102679 A1 * | 4/2010 | Kawada | ........................ 310/363 |
| 2012/0019108 A1 | 1/2012 | Tanaka et al. | |

FOREIGN PATENT DOCUMENTS

| | | | | |
|---|---|---|---|---|
| EP | 2 159 205 A1 * | 3/2010 | ............ | H01L 41/083 |
| JP | A-2006-286911 | 10/2006 | | |
| JP | A-2007-320840 | 12/2007 | | |

(Continued)

OTHER PUBLICATIONS

Tanaka, et al., "Thermal Reliability of Alkaline Niobate-Based Lead-Free Piezoelectric Ceramics", Sep. 24, 2009, Japanese Journal of Applied Physics 48 (2009), pp. 09KD08-1 to 09KD08-4.*

(Continued)

*Primary Examiner* — Thomas Dougherty
(74) *Attorney, Agent, or Firm* — Oliff PLC

(57) ABSTRACT

A piezoelectric device includes a first electrode film, a piezoelectric film disposed on the first electrode film, and a second electrode film disposed on the piezoelectric film. At least one of the first and second electrode films is composed of an alloy, and a main component of the alloy is a metal selected from the group consisting of Ti, Al, Mg, and Zn. The piezoelectric film has a main composition represented by $(K_{1-x-y-w-v}Na_xLi_yBa_wSr_v)_m(Nb_{1-z-u}Ta_zZr_u)O_3$ (1), where x, y, z, w, v, u, and m in formula (1) satisfy $0.4<x\leq0.7$, $0.02\leq y\leq0.11$, $0.5\leq x+y<0.75$, $0<z\leq0.28$, $0<w\leq0.02$, $0.02\leq v\leq0.11$, $0.02\leq u\leq0.11$, and $0.95\leq m<1.2$, and contains 1% by mass or less of MnO relative to the main composition.

8 Claims, 4 Drawing Sheets

| | | | | | | |
|---|---|---|---|---|---|---|
| Li⁺ | −3.040 | Nb³⁺ | −1.099 | Ru²⁺ | +0.455 | |
| K⁺ | −2.925 | Ta⁵⁺ | −0.810 | Cu⁺ | +0.520 | |
| Rb⁺ | −2.924 | Zn²⁺ | −0.763 | Rh⁺ | +0.600 | |
| Ba²⁺ | −2.920 | Cr³⁺ | −0.740 | Hg⁺ | +0.796 | |
| Sr²⁺ | −2.890 | Fe²⁺ | −0.440 | Ag⁺ | +0.799 | |
| Ca²⁺ | −2.840 | Cd²⁺ | −0.403 | Hg²⁺ | +0.850 | |
| Na⁺ | −2.714 | Co²⁺ | −0.277 | Pd²⁺ | +0.915 | |
| Mg²⁺ | −2.356 | Ni²⁺ | −0.257 | Ir³⁺ | +1.156 | |
| Al³⁺ | −1.676 | Sn²⁺ | −0.138 | Pt²⁺ | +1.188 | |
| Ti²⁺ | −1.630 | Pb²⁺ | −0.126 | Au³⁺ | +1.520 | |
| Zr⁴⁺ | −1.550 | H⁺ | 0.000 | Au⁺ | +1.830 | |
| Mn²⁺ | −1.180 | Cu²⁺ | +0.337 | | | |

UNIT: V

LOW ⟵ OXIDATION-REDUCTION POTENTIAL ⟶ HIGH

HIGH ⟵ IONIZATION TENDENCY ⟶ LOW

(56) References Cited

FOREIGN PATENT DOCUMENTS

| | | | | |
|---|---|---|---|---|
| JP | A-2009-049355 | 3/2009 | | |
| JP | A-2010-103194 | 5/2010 | | |
| JP | B2-4674405 | 4/2011 | | |
| WO | WO-2006-117952 A1 * | 11/2006 | ............... | C04B 35/00 |
| WO | WO-2010-134604 A1 * | 11/2010 | ............ | H01L 41/187 |
| WO | WO 2011/118686 A1 | 9/2011 | | |

OTHER PUBLICATIONS

Jul. 14, 2015 Office Action issued in U.S. Appl. No. 13/893,930.
Dec. 24, 2014 Office Action issued in U.S. Appl. No. 13/893,930.
U.S. Appl. No. 13/893,930, filed May 14, 2013.

\* cited by examiner

FIG. 2

| | | | | | |
|---|---|---|---|---|---|
| $Li^+$ | −3.040 | $Nb^{3+}$ | −1.099 | $Ru^{2+}$ | +0.455 |
| $K^+$ | −2.925 | $Ta^{5+}$ | −0.810 | $Cu^+$ | +0.520 |
| $Rb^+$ | −2.924 | $Zn^{2+}$ | −0.763 | $Rh^+$ | +0.600 |
| $Ba^{2+}$ | −2.920 | $Cr^{3+}$ | −0.740 | $Hg^+$ | +0.796 |
| $Sr^{2+}$ | −2.890 | $Fe^{2+}$ | −0.440 | $Ag^+$ | +0.799 |
| $Ca^{2+}$ | −2.840 | $Cd^{2+}$ | −0.403 | $Hg^{2+}$ | +0.850 |
| $Na^+$ | −2.714 | $Co^{2+}$ | −0.277 | $Pd^{2+}$ | +0.915 |
| $Mg^{2+}$ | −2.356 | $Ni^{2+}$ | −0.257 | $Ir^{3+}$ | +1.156 |
| $Al^{3+}$ | −1.676 | $Sn^{2+}$ | −0.138 | $Pt^{2+}$ | +1.188 |
| $Ti^{2+}$ | −1.630 | $Pb^{2+}$ | −0.126 | $Au^{3+}$ | +1.520 |
| $Zr^{4+}$ | −1.550 | $H^+$ | 0.000 | $Au^+$ | +1.830 |
| $Mn^{2+}$ | −1.180 | $Cu^{2+}$ | +0.337 | | |

UNIT: V

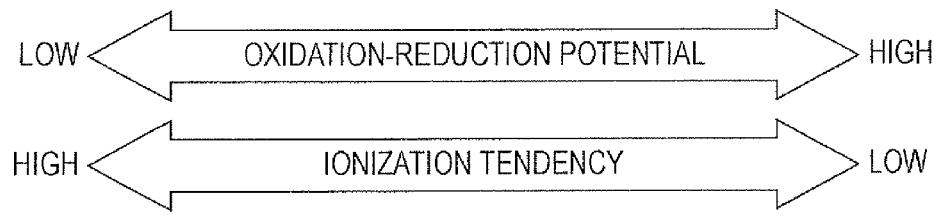

LOW ⟵ OXIDATION-REDUCTION POTENTIAL ⟶ HIGH

HIGH ⟵ IONIZATION TENDENCY ⟶ LOW

PIEZOELECTRIC DEVICE

BACKGROUND OF THE INVENTION

1. Field of the Invention

The present invention relates to a piezoelectric device.

2. Description of the Related Art

Japanese Unexamined Patent Application Publication Nos. 2010-103194 and 2006-286911 disclose a piezoelectric device including a dielectric film and a pair of electrode films that sandwich the dielectric film. The electrode films are composed of a noble metal such as Au, Pt, or Ir. When the dielectric film serves as a piezoelectric film, a dielectric film composed of lead zirconate titanate (PZT) containing Pb is generally used.

In recent years, "lead-free" industrial products have been urgently demanded to protect the environment, and thus existing piezoelectric materials are increasingly replaced with lead-free piezoelectric materials. An example of a promising lead-free piezoelectric material is a potassium sodium niobate (KNN)-based piezoelectric material disclosed in Japanese Unexamined Patent Application Publication No. 2007-320840.

However, many lead-free piezoelectric materials provide a piezoelectric film having a small displacement and low reliability. Among such lead-free piezoelectric materials, the piezoelectricity of a KNN-based piezoelectric material has been improved. However, such a KNN-based piezoelectric material does not have a large displacement unlike PZT-based piezoelectric materials. In addition, the KNN-based piezoelectric material has low moisture resistance and thus the piezoelectricity is degraded when the KNN-based piezoelectric material is exposed to a high-humidity environment.

In the case of lead zirconate titanate (PZT), if a base metal element such as Ni is used for electrodes, Pb that is one of main components constituting lead zirconate titanate (PZT) is present in the form of a metal and the base metal element such as Ni that is a material for electrodes is present in the form of an oxide from the viewpoint of the relationship of oxidation-reduction potential between the piezoelectric material and the electrode. This poses a problem in that the life and reliability of piezoelectric devices are decreased. Therefore, when a Pb-containing piezoelectric material is used, a noble metal needs to be used for electrodes, which makes it difficult to reduce the cost.

SUMMARY OF THE INVENTION

Accordingly, it is an object of the present invention to provide a piezoelectric device that has a large displacement and high reliability in terms of moisture resistance and that is produced at low cost without using Pb in consideration of environment.

A piezoelectric device according to an embodiment of the present invention includes a first electrode film, a piezoelectric film disposed on the first electrode film, and a second electrode film disposed on the piezoelectric film. The oxidation-reduction potential of a metal element constituting the first and second electrode films is higher than oxidation-reduction potentials of all metal elements constituting the piezoelectric film.

In the present invention, the oxidation-reduction potential of a metal element constituting the pair of electrode films is preferably higher than oxidation-reduction potentials of all metal elements constituting the piezoelectric film. Thus, the piezoelectric film is not reduced by the electrode films, which provides a chemically and electrically stable state. Consequently, the life and reliability of the piezoelectric device are further improved.

A piezoelectric material constituting the piezoelectric film is represented by formula (1) below, and the piezoelectric film contains 1% by mass or less of MnO relative to the composition represented by formula (1).

$$(K_{1-x-y-w-v}Na_xLi_yBa_wSr_v)_m(Nb_{1-z-u}Ta_zZr_u)O_3 \quad (1)$$

In formula (1), x, y, z, w, v, u, and m satisfy $0.4 < x \le 0.7$, $0.02 \le y \le 0.11$, $0.5 \le x+y < 0.75$, $0 < z \le 0.28$, $0 < w \le 0.02$, $0.02 \le v \le 0.11$, $0.02 \le u \le 0.11$, and $0.95 \le m < 1.2$.

In the present invention, by controlling the composition of an alkali niobate-based piezoelectric film to be a desired composition, the displacement and moisture resistance of the piezoelectric device can be improved. Furthermore, when the oxidation-reduction potential of a material used for electrodes is higher than those of metal elements constituting the piezoelectric film having the above composition, the piezoelectric film is not reduced by the electrode films, which provides a chemically and electrically stable state. Consequently, the life and reliability of the piezoelectric device are improved.

The piezoelectric film preferably has a preferentially oriented structure. With the preferential orientation, the crystal plane (axis) is oriented in one direction and a crystal structure close to an ideal single crystal structure is obtained. Thus, the piezoelectricity is considerably improved.

In the present invention, the term "preferentially oriented structure" means a structure in which the peak intensity belonging to one particular crystal lattice plane is 50% or more of the total intensity of all peaks in the X-ray diffraction measurement.

The piezoelectric film preferably has a tetragonal structure as a main phase in a room temperature range. A piezoelectric film having a tetragonal structure has good piezoelectricity. Furthermore, when a phase boundary with a rhombohedral structure and an orthorhombic structure is formed, the piezoelectricity is further improved.

At least one of the first and second electrode films is composed of an alloy, and a main component of the alloy is a metal selected from the group consisting of Zn, Fe, Co, Ni, and Cu. When the oxidation-reduction potential of a material for the electrode films is higher than the oxidation-reduction potentials of metal elements constituting the piezoelectric film, the piezoelectric film is not reduced by the electrode films, which provides a chemically and electrically stable state. Consequently, the life and reliability of the piezoelectric device are improved. The material for the electrode films is preferably an alloy of metals selected from the group consisting of Zn, Fe, Co, Ni, and Cu.

The first and second electrode films preferably have a non-oriented or amorphous structure. The term "non-oriented structure" means a structure in which the peak intensity belonging to any crystal plane is less than 50% of the total intensity of all peaks in the X-ray diffraction measurement. The term "amorphous structure" means a structure in which no peaks belonging to crystal lattice planes are observed in the X-ray diffraction measurement.

The first and second electrode films in the present invention may contain a metal element other than the above-described metal elements. An element other than metals may also be contained.

In order to improve the adhesiveness between the piezoelectric film and the electrode films, the piezoelectric device preferably further includes an intermediate film composed of a metal selected from Al, Ti, Zr, Cr, Co, and Ni and disposed between the piezoelectric film and at least one of the first and second electrode films. The oxidation-reduction potential of the metal constituting the intermediate film is preferably lower than that of at least one of the metal elements constituting the piezoelectric film.

The intermediate film may be in contact with the electrode films and the piezoelectric film.

In this case, a minimum oxidation-reduction reaction occurs between the intermediate film and the piezoelectric film and thus the adhesiveness between the intermediate film and the piezoelectric film is believed to be improved. However, if the oxidation-reduction reaction excessively proceeds, the composition of the piezoelectric film becomes unbalanced and the piezoelectricity is degraded. Therefore, the thickness of the intermediate film needs to be suitably set.

In the case where the intermediate film is disposed, a conductive oxide film composed of a conductive oxide may be disposed between the piezoelectric film and at least one of the first and second electrode films and preferably between the intermediate film and the piezoelectric film in order to prevent the degradation of the characteristics of the device. Consequently, the piezoelectric film is not easily reduced by the electrode films and the degradation of the characteristics is further prevented.

The intermediate film or the conductive oxide film may be in contact with the piezoelectric film.

The piezoelectric device may further include a metal film having a preferentially oriented structure between the second electrode film and the piezoelectric film. The metal film may be in contact with the second electrode film and the piezoelectric film.

The present invention provides a piezoelectric device that has a large displacement and high reliability in terms of moisture resistance and that is produced at low cost without using Pb.

BRIEF DESCRIPTION OF THE DRAWINGS

FIG. 2 shows oxidation-reduction potentials of metals;

DESCRIPTION OF THE PREFERRED EMBODIMENTS

Figure 1A:
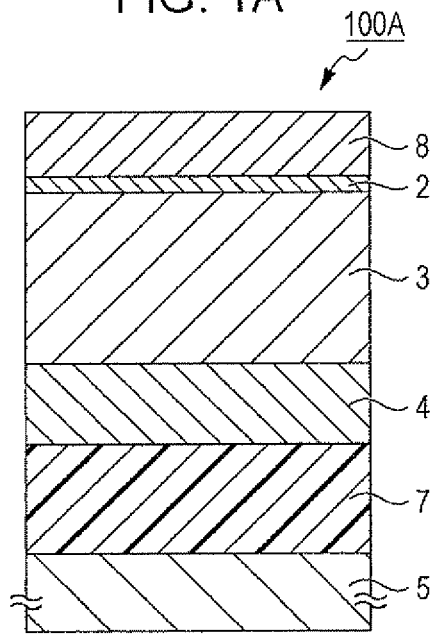
FIGS. 1A to 1D are schematic sectional views of piezoelectric devices according to embodiments of the present invention.

Embodiments of the present invention will now be described in detail with reference to the attached drawings.
Piezoelectric Device 100A A piezoelectric device 100A according to an embodiment of the present invention will be described with reference to FIG. 1A. The piezoelectric device 100A is disposed on a resin layer 7 formed on a support substrate 5 and includes a first electrode film 4, a piezoelectric film 3, a metal film 2, and a second electrode film 8 in that order.

The piezoelectric film 3 is a film having a composition represented by formula (1) below. Specifically, the piezoelectric film 3 has a composition represented by formula (1) below and contains 1% by mass or less of MnO relative to the composition:

$$(K_{1-x-y-w-v}Na_xLi_yBa_wSr_v)_m(Nb_{1-z-u}Ta_zZr_u)O_3 \quad (1)$$

where x, y, z, w, v, u, and m in formula (1) satisfy $0.4<x\leq0.7$, $0.02\leq y\leq0.11$, $0.5\leq x+y<0.75$, $0<z\leq0.28$, $0<w\leq0.02$, $0.02\leq v\leq0.11$, $0.02\leq u\leq0.11$, and $0.95\leq m<1.2$.

In formula (1) above, when the content of sodium (Na), that is, x satisfies $0.4<x\leq0.7$ and preferably $0.43\leq x\leq0.7$, a piezoelectric thin film having better piezoelectricity can be provided. If x is more than 0.7 or 0.4 or less, the content of potassium is relatively increased, which degrades the moisture resistance.

When the content of lithium (Li), that is, y satisfies $0.02\leq y\leq0.11$ and preferably $0.05\leq y\leq0.11$, a piezoelectric thin film having better piezoelectricity can be provided. If y is more than 0.11 or less than 0.02, the moisture resistance is degraded.

When the content of tantalum (Ta), that is, z satisfies $0<z\leq0.28$ and preferably $0.02\leq z\leq0.11$, a piezoelectric thin film having better piezoelectricity can be provided. If z is 0 or more than 0.28, the moisture resistance is degraded.

When the content of barium (Ba), that is, w satisfies $0<w\leq0.02$ and preferably $0.003\leq w\leq0.01$, a piezoelectric thin film having better piezoelectricity can be provided. If w is 0 or more than 0.02, the displacement generated is decreased.

The content of strontium (Sr), that is, v satisfies $0.02\leq v\leq0.11$ and preferably $0.02\leq v\leq0.07$. The content of zirconium (Zr), that is, u satisfies $0.02\leq u\leq0.11$ and preferably $0.02\leq u\leq0.07$. When the above ranges are satisfied, the degradation of piezoelectricity due to temperature variation can be suppressed and the displacement generated can be increased. If v or u is more than 0.11, the displacement generated is decreased and the moisture resistance is degraded. If v or u is less than 0.02, the moisture resistance is degraded.

When m in formula (1) above, that is, the ratio of an A site and a B site of a perovskite structure oxide is $0.95\leq m<1.2$, a film having a large displacement generated can be provided. If m is less than 0.95 or 1.2 or more, a large amount of unreacted product is present and thus the displacement generated is decreased and the moisture resistance is degraded.

When the piezoelectric film contains 1% by mass or less of manganese (Mn) in terms of manganese oxide (MnO) as a minor component in addition to the main components, the resistance of a piezoelectric thin film can be increased, which achieves a larger displacement.

The piezoelectric film preferably has a preferentially oriented structure. With the preferential orientation, the crystal plane (axis) is oriented in one direction and a crystal structure close to an ideal single crystal structure is obtained. Thus, the piezoelectricity is considerably improved.

The piezoelectric film 3 has a tetragonal structure as a main phase in a room temperature range and may also have an orthorhombic structure or a rhombohedral structure in addition to the tetragonal structure serving as the main phase. When the piezoelectric film 3 has such a structure, excellent piezoelectricity can be maintained without being affected by a large temperature variation.

The thickness of the piezoelectric film 3 is not particularly limited, and is generally about 1000 to 4000 nm.
Electrode Films 4 and 8

The first electrode film 4 is disposed on the lower surface side of the piezoelectric film 3 and the second electrode film 8 is disposed on the upper surface side of the piezoelectric film 3.

Specifically, at least one of the pair of electrode films 4 and 8 is composed of an alloy and the main component of the alloy is preferably a metal selected from the group consisting of Zn, Fe, Co, Ni, and Cu. Herein, the main component is a component having the highest content on an atomic ratio basis. Both the pair of electrode films 4 and 8 are preferably composed of the above-described alloy. The electrode films 4 and 8 may contain a minor component. The minor component is a component other than the main component and is preferably Mg, Al, Sn, or the like.

The case where the electrode films are composed of a Zn alloy and the case where the electrode films are composed of a Cu alloy will be described below.

Zn Alloy

An example of an alloy containing Zn as a main component is an alloy containing Zn as a main component and Al as a minor component. For example, an alloy containing 80 to 92 atm % of Zn and 8 to 20 atm % of Al is preferably used. The content of a third additional element other than Zn and Al is preferably 2 atm % or less.

Cu Alloy

An example of an alloy containing Cu as a main component is an alloy containing Cu as a main component and Sn as a minor component. For example, an alloy containing 90 to 97 atm % of Cu and 3 to 10 atm % of Sn is preferably used. The content of a third additional element other than Cu and Sn is preferably 2 atm % or less.

Since these alloys generally have oxidation resistance higher than that of an elemental metal of their main component, the reliability of piezoelectric devices can be improved. In view of driving characteristics of piezoelectric devices, the Young's modulus of the electrode films 4 and 8 is preferably lower than that of the piezoelectric film 3 and, for example, preferably 100 GPa or less.

In order to prevent the degradation of characteristics due to battery effects and improve the reliability, the oxidation-reduction potential of the alloy constituting the electrode films 4 and 8 is preferably higher than the oxidation-reduction potentials of all metal elements constituting the piezoelectric film 3. This considerably suppresses the oxidation-reduction reaction between the piezoelectric film 3 and the electrode films 4 and 8, reduces the degradation of the piezoelectric film 3 due to battery effects over time, and improves the reliability of devices. The material for the electrode films 4 and 8 preferably has a melting point sufficiently higher than a temperature resulting from the application of heat load in a process to be performed later.

A material having a relatively low melting point that excludes Pt, Ir, Pd, or Rh, which has a high melting point, can also be used as the material for the electrode films 4 and 8.

The thickness of the electrode films 4 and 8 is not particularly limited, and may be 100 to 200 nm.

Both of the electrode films 4 and 8 preferably have a non-oriented structure or an amorphous structure. Both the two electrode films may have an amorphous structure, both the two electrode films may have a non-oriented structure, or one of the two electrode films may have a non-oriented structure and the other may have an amorphous structure. The term "non-oriented structure" means a structure in which the peak intensity belonging to any crystal plane is less than 50% of the total intensity of all peaks in the X-ray diffraction measurement. In the X-ray diffraction measurement result of the electrode films 4 and 8, the peak intensity belonging to one particular crystal lattice plane is preferably 10% or less of the total intensity of all peaks. The term "amorphous structure" means a structure in which no peaks belonging to crystal lattice planes are observed in the X-ray diffraction measurement.

Metal Film 2

The metal film 2 is disposed between the second electrode film 8 and the piezoelectric film 3 so as to be in contact with the piezoelectric film 3 and the second electrode film 8. The metal film 2 has a preferentially oriented structure. In other words, the metal film 2 has a structure in which the peak intensity belonging to one particular crystal lattice plane is 50% or more of the total intensity of all peaks in the X-ray diffraction measurement. The metal film 2 preferably has a structure in which the peak intensity belonging to one particular crystal lattice plane is 80% or more of the total intensity of all peaks in the X-ray diffraction measurement. The thickness of the metal film 2 is selected so that the crystallinity of the piezoelectric film 3 that is epitaxially grown while being in contact with the metal film 2 is increased.

For example, the thickness of the metal film 2 is suitably 20 to 70 nm. The metal film 2 alone having such a thickness cannot function as an electrode film of the piezoelectric device 100A. A metal constituting the metal film 2 can be selected from metals (including alloys) whose a-axis lattice constant is smaller than that of the piezoelectric film 3 and which have heat resistance to a temperature during the formation of a piezoelectric film. Such a metal constituting the metal film 2 is preferably Pt or Rh.

The metal film 2 is left between the piezoelectric film 3 and the second electrode film 8 whereas no other films are present between the piezoelectric film 3 and the first electrode film 4.

Piezoelectric Device 100B

A piezoelectric device 100B according to an embodiment of the present invention will be described with reference to FIG. 1B. The piezoelectric device 100B is different from the piezoelectric device 100A in that the piezoelectric device 100B does not include the metal film 2 and the second electrode film 8 is directly in contact with the piezoelectric film 3. As in the piezoelectric device 100A, no other films are present between the piezoelectric film 3 and the first electrode film 4.

Piezoelectric Devices 100C and 100C'

A piezoelectric device 100C according to an embodiment of the present invention will be described with reference to FIG. 1C. The piezoelectric device 100C is different from the piezoelectric device 100B in that an intermediate film 9 composed of a metal having an oxidation-reduction potential lower than that of at least one of the metal elements constituting the piezoelectric film 3 is formed between the second electrode film 8 and the piezoelectric film 3 and between the first electrode film 4 and the piezoelectric film 3.

For example, in the case where the piezoelectric film 3 contains 1% by mass or less of MnO relative to the composition represented by formula (1) below, Ta (oxidation-reduction potential: −0.812 V), which has the highest oxidation-reduction potential among elements other than oxygen, serves as reference. A metal film composed of Ti (oxidation-reduction potential: −1.63 V), which has an oxidation-reduction potential lower than that of Ta, can be used as the intermediate film 9.

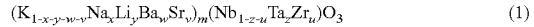

$$(K_{1-x-y-w-v}Na_xLi_yBa_wSr_v)_m(Nb_{1-z-u}Ta_zZr_u)O_3 \qquad (1)$$

In formula (1), x, y, z, w, v, u, and m satisfy $0.4 < x \leq 0.7$, $0.02 \leq y \leq 0.11$, $0.5 \leq x+y < 0.75$, $0 < z \leq 0.28$, $0 < w \leq 0.02$, $0.02 \leq v \leq 0.11$, $0.02 \leq u \leq 0.11$, and $0.95 \leq m < 1.2$.

The intermediate film 9 is preferably composed of an element selected from Al, Ti, Zr, Cr, Co, and Ni.

The thickness of the intermediate film 9 is preferably 2 to 5 nm in order to suppress the oxidation-reduction reaction between the piezoelectric film 3 and the intermediate film 9 as much as possible while increasing the adhesion strength between the piezoelectric film 3 and the electrode films 4 and 8. If the thickness is more than 5 nm, the characteristics of the piezoelectric film 3 may be degraded. If the thickness is less than 2 nm, the intermediate film 9 sometimes does not sufficiently function as an adhesion layer. The intermediate film 9 may have a preferentially oriented structure or a non-oriented or amorphous structure, but preferably has a non-oriented or amorphous structure. The preferentially oriented structure, non-oriented structure, and amorphous structure have been described above. In the intermediate film 9, the peak intensity belonging to any crystal plane is preferably 10% or less of the total intensity of all peaks in the X-ray diffraction measurement.

For example, in the case where the piezoelectric film 3 has a composition represented by formula (1) below and the intermediate film 9 is composed of Ti, the surface of the piezoelectric film 3 may be reduced because the oxidation-reduction potential of Ti (−1.63 V) is lower than the oxidation-reduction potential of Ta (−0.812 V). Therefore, the thickness of the intermediate film 9 is preferably not excessively increased while the adhesiveness is improved.

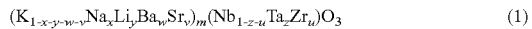

$$(K_{1-x-y-w-v}Na_xLi_yBa_wSr_v)_m(Nb_{1-z-u}Ta_zZr_u)O_3 \quad (1)$$

In formula (1), x, y, z, w, v, u, and m satisfy $0.4 < x \le 0.7$, $0.02 \le y \le 0.11$, $0.5 \le x+y < 0.75$, $0 < z \le 0.28$, $0 < w \le 0.02$, $0.02 \le v \le 0.11$, $0.02 \le u \le 0.11$, and $0.95 \le m < 1.2$.

Even if the metal elements of the alloy constituting the electrode films 4 and 8 have oxidation-reduction potentials higher than those of all metal elements constituting the piezoelectric film 3, the adhesion strength between the piezoelectric film 3 and the electrode films 4 and 8 is easily increased due to the presence of the intermediate film 9.

Piezoelectric Devices 100D and 100D'

Piezoelectric devices 100D and 100D' according to an embodiment of the present invention will be described with reference to FIG. 1D. The piezoelectric device 100D is different from the piezoelectric device 100C in that a conductive oxide film 10 is disposed between the piezoelectric film 3 and the intermediate film 9. Note that the conductive oxide film 10 may be a single film and may be present between the piezoelectric film 3 and the electrode film 4 and between the piezoelectric film 3 and the electrode film 8.

The conductive oxide film 10 produces an effect of suppressing the oxidation-reduction reaction between the intermediate film 9 and the piezoelectric film 3. One of metal elements constituting the conductive oxide preferably has an oxidation-reduction potential higher than those of all metal elements constituting the piezoelectric film 3, and the conductive oxide preferably contains a metal element having an oxidation-reduction potential lower than that of the metal element constituting the intermediate film 9. Examples of the conductive oxide include $SrRuO_3$ (SRO) and $In_2O_3$—$SnO_2$ (ITO).

The thickness of the conductive oxide film 10 is, for example, about 5 to 20 nm. The conductive oxide film 10 can be formed by, for example, sputtering.

The conductive oxide film 10 may have a preferentially oriented structure or a non-oriented or amorphous structure, but preferably has a non-oriented or amorphous structure. The preferentially oriented structure, non-oriented structure, and amorphous structure have been described above. In the conductive oxide film 10, the peak intensity belonging to any crystal plane is preferably 10% or less of the total intensity of all peaks in the X-ray diffraction measurement.

The piezoelectric device according to this embodiment produces the following effects. By employing a particular alloy, the oxidation resistance of the electrode films can be increased and the cost for the electrode films can be decreased. The Young's modulus of the electrode films is easily decreased and thus the performance of the piezoelectric device can be improved. Furthermore, the film formation rate of the electrode films can be increased.

In the piezoelectric devices 100B to 100D, the two principal surfaces of the piezoelectric film 3 are each preferably in contact with a film having a non-oriented or amorphous structure. In this case, a base film used to epitaxially grow the piezoelectric film 3 is removed.

Method for Producing Piezoelectric Device

A method for producing the above-described piezoelectric devices 100A to 100D will now be described with reference to FIGS. 3A to 3G.

Figure 3A:
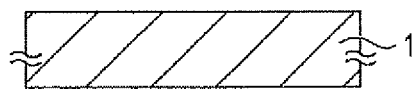
FIGS. 3A to 3G are schematic sectional views showing a method for producing the piezoelectric devices in FIG. 1.

First, as shown in FIG. 3A, a substrate 1 is prepared. The substrate 1 is composed of single crystal silicon, sapphire, magnesium oxide, or the like.

Figure 3B:

As shown in FIG. 3B, a metal film 2 serving as a base film for a piezoelectric film 3 is formed on the substrate 1. The metal film 2 is formed by epitaxially growing a metal material on the substrate 1 by, for example, vapor deposition or sputtering while the substrate 1 is heated to high temperature. For example, a metal film 2 having a preferentially oriented structure corresponding to the plane orientation of the substrate 1 can be formed by sputtering a metal material while the substrate 1 is heated to about 400 to 600° C. The metal film 2 is not necessarily formed. However, by forming the metal film 2, a piezoelectric film 3 having good crystallinity is easily obtained.

Figure 3C:
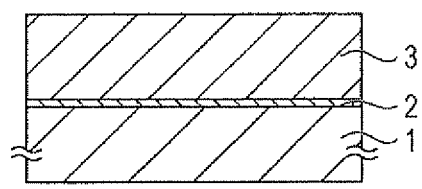

As shown in FIG. 3C, a piezoelectric film 3 is then formed on the metal film 2. The piezoelectric film 3 having a preferentially oriented structure can be formed by epitaxially growing a piezoelectric material on a base, that is, the substrate 1 and the metal film 2 by sputtering or the like while the substrate 1 and the metal film 2 are heated to high temperature. The substrate 1 and the metal film 2 are preferably heated to about 400 to 600° C.

Figure 3D:
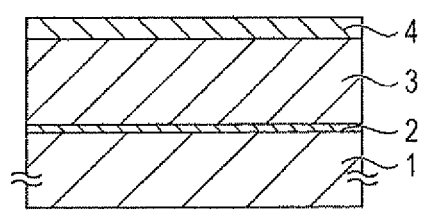

As shown in FIG. 3D, an electrode film 4 is then formed on the piezoelectric film 3.

The electrode film 4 is preferably formed on the piezoelectric film 3 using a metal material without performing epitaxial growth. Specifically, a film having a non-oriented or amorphous structure is formed by performing sputtering, vapor deposition, or the like at low temperature. Since epitaxial growth is not performed, the electrode film 4 can be formed at a high film formation rate within a short time. The temperature of the substrate 1 and the piezoelectric film 3 is preferably set to room temperature to 200° C.

Figure 3E:
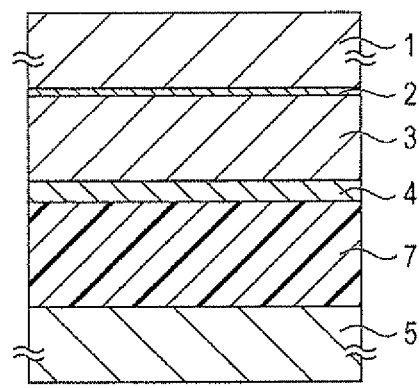

As shown in FIG. 3E, after the formation of the electrode film 4, the electrode film 4 is bonded to a support substrate 5 through a resin layer 7.

An example of the support substrate 5 is a polycrystalline silicon substrate. The resin layer 7 is composed of, for example, an epoxy resin or a silicon resin. An epoxy resin is preferably used in view of rigidity. The electrode film 4 is bonded to the support substrate 5 by applying an adhesive on the support substrate 5 and the electrode film 4 by spin coating or the like with a thickness of about 2000 to 5000 nm and then placing the electrode film 4 on the support substrate 5 in a vacuum.

Figure 3F:
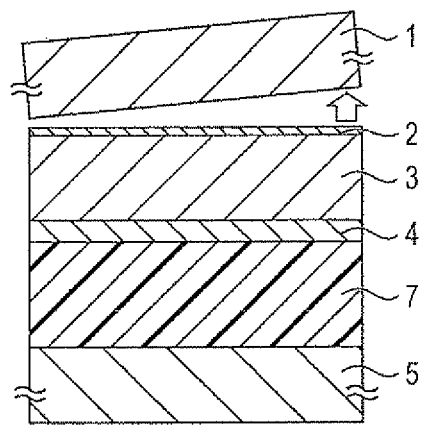

As shown in FIG. 3F, the substrate 1 is then removed from the metal film 2. The substrate 1 can be removed by chemical mechanical polishing (CMP), reactive ion etching (RIE), or the like. By removing the substrate 1, the metal film 2 serving as the base film for the piezoelectric film 3 is exposed so as to constitute the uppermost surface.

Figure 3G:
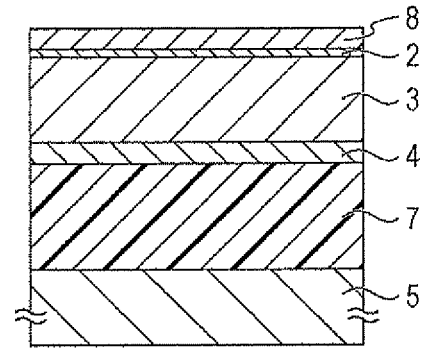

As shown in FIG. 3G, an electrode film 8 is then formed on the metal film 2. The electrode film 8 is formed in the same manner as in the electrode film 4. Thus, a piezoelectric device 100A including the electrode films 4 and 8 and the piezoelectric film 3 is completed.

The piezoelectric device 100A may be optionally patterned on the support substrate 5. A protective film for protecting the piezoelectric device 100A may be optionally formed. The piezoelectric device 100A may be optionally cut into pieces. In this case, the piezoelectric device 100A may be detached from the support substrate 5 and then cut into pieces. Alternatively, the piezoelectric device 100A may be cut into pieces together with the support substrate 5.

Through the above-described process, a piezoelectric device 100A including the electrode films 4 and 8 disposed on and below the piezoelectric film 3 can be provided.

In the case where the piezoelectric device 100B is produced, the metal film 2 may also be removed together with the substrate 1 in the process shown, in FIG. 3F.

In the case where the piezoelectric device 100C is produced, an intermediate film 9 may be formed before the formation of the electrode films 4 and 8 in the piezoelectric device 100B. The intermediate film 9 is formed by sputtering or the like. The intermediate film 9 is also not necessarily formed by epitaxial growth.

In the case where the piezoelectric device 100D is produced, a conductive oxide film 10 and an intermediate film 9 may be formed in that order before the formation of the electrode films 4 and 8 in the piezoelectric device 100B. The conductive oxide film 10 is formed by sputtering or the like. The conductive oxide film 10 is also not necessarily formed by epitaxial growth.

In the piezoelectric device 100A, heating of a substrate and low-rate sputtering are not essential conditions in the formation of the electrode films 4 and 8. Therefore, the film formation time is considerably shortened from 10 to 20 minutes per layer, which is an existing film formation time. Because of a combined effect of the improvement in process throughput and the decrease in material cost of the electrode films 4 and 8, the production cost of piezoelectric devices is considerably decreased.

EXAMPLES

Example 1

Piezoelectric Device 100A

Figure 1C:
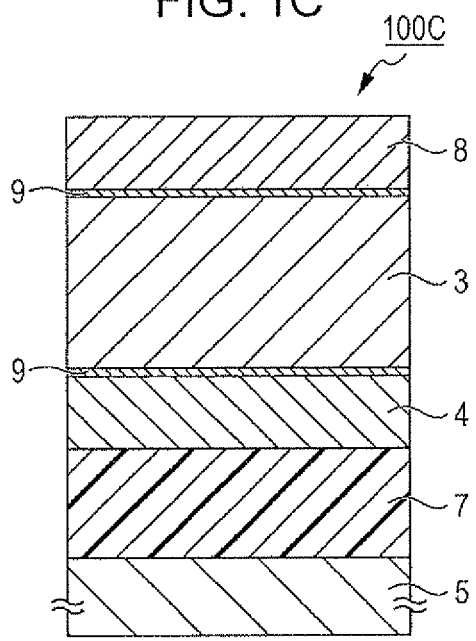
Figure 1B:
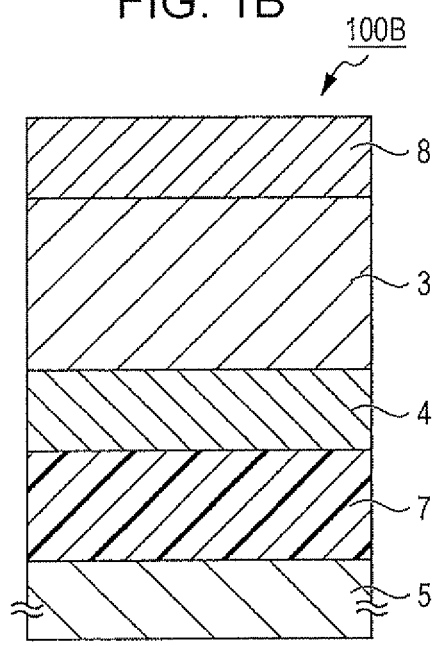
Figure 1D:
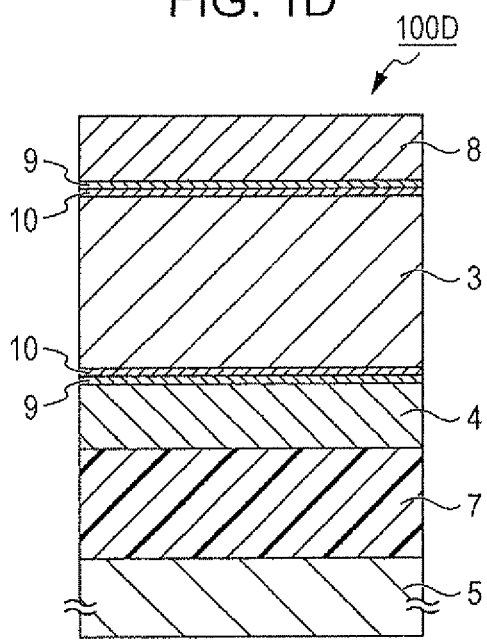

As shown in FIG. 1A, a metal film 2 having a (100) preferential orientation was formed on a silicon substrate 1 by epitaxially growing a Pt film having a thickness of 50 nm on a silicon substrate. A piezoelectric film 3 having a thickness of 2000 nm was formed on the Pt film by sputtering that uses a potassium sodium niobate (KNN) target substrate. An electrode film 4 composed of Zn—Al was formed on the piezoelectric film 3, and the electrode film 4 was bonded to a silicon support substrate 5 through an epoxy resin layer 7. Subsequently, the silicon substrate 1 was removed from the metal film 2 by RIE. A Zn—Al alloy film (having the same composition as that of the electrode film 4) having a thickness of 200 nm was formed on the metal film 2 by sputtering at room temperature and thus an amorphous electrode film 8 was formed. As a result, a piezoelectric device 100A was obtained. Note that the composition of the KNN target substrate was adjusted so that the piezoelectric film 3 had the following composition.

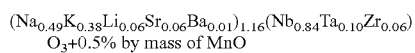

Example 2

Piezoelectric Device 100B

A piezoelectric device 100B was produced in the same manner as in Example 1, except that the metal film 2 was also removed by etching when the silicon substrate 1 was removed.

Example 3

Piezoelectric Device 100C

A piezoelectric device 100C was produced in the same manner as in Example 2, except that an intermediate film 9 composed of Ti and having a non-oriented structure was formed by sputtering between the piezoelectric film 3 and the electrode films 4 and 8 so as to have a thickness of 5 nm. Thus, the adhesiveness between the piezoelectric film 3 and the electrode film 4 and between the piezoelectric film 3 and the electrode film 8 was improved.

Example 4

Piezoelectric Device 100C'

A piezoelectric device 100C' was produced in the same manner as in Example 3, except that an intermediate film 9 composed of Zr instead of Ti and having a non-oriented structure was formed by sputtering between the piezoelectric film 3 and the electrode films 4 and 8 so as to have a thickness of 5 nm. Thus, as in the case of Ti, the adhesiveness between the piezoelectric film 3 and the electrode film 4 and between the piezoelectric film 3 and the electrode film 8 was improved.

Example 5

Piezoelectric Device 100D

A piezoelectric device 100D was produced in the same manner as in Example 3, except that a conductive oxide film 10 composed of $SrRuO_3$ and having a non-oriented structure was formed by sputtering between the piezoelectric film 3 and the intermediate film 9 so as to have a thickness of 20 nm. According to Example 5, the chemical stability of the piezoelectric film 3 was improved by suppressing the oxidation-reduction reaction between the intermediate film 9 and the piezoelectric film 3 while the adhesiveness between the electrode films 4 and 8 and the piezoelectric film 3 was improved. Thus, a high-reliability device was provided.

Example 6

Piezoelectric Device 100D'

A piezoelectric device 100D' was produced in the same manner as in Example 5, except that a conductive oxide film 10 composed of $In_2O_3$—$SnO_2$ (ITO) and having a non-oriented structure was formed by sputtering between the piezoelectric film 3 and the intermediate film 9 so as to have a thickness of 20 nm. According to Example 6, as in the case of $SrRuO_3$, the chemical stability of the piezoelectric film 3 was improved by suppressing the oxidation-reduction reaction between the intermediate film 9 and the piezoelectric film 3 while the adhesiveness between the electrode films 4 and 8 and the piezoelectric film 3 was improved. Thus, a high-reliability device was provided.

Example 7

Piezoelectric Device 101A

A piezoelectric device 101A was produced in the same manner as in Example 1, except that the electrode films 4 and 8 were composed of a $Cu_{95}Sn_5$ alloy.

Comparative Example 1

Piezoelectric Device 110A

Figure 4:
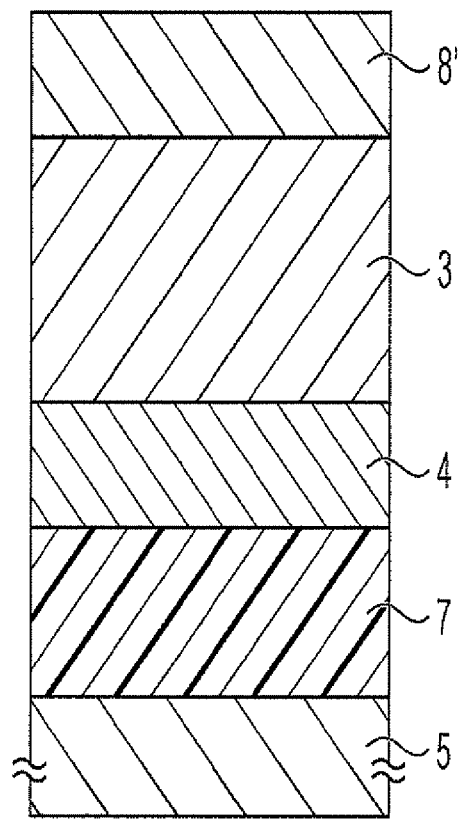
FIG. 4 is a schematic sectional view of a piezoelectric device of Comparative Example 1.

An electrode film 8' having a (100) preferential orientation was formed on a silicon substrate 1 by epitaxially growing a Pt film having a thickness of 200 nm by sputtering in a direction of the plane orientation of the silicon substrate 1 while the silicon substrate 1 was heated to 400° C. The film formation rate at this time was 0.2 nm/sec. A film having a thickness of 2000 nm and a composition represented by formula below was formed on the electrode film 8' by sputtering while the silicon substrate 1 was heated to 550° C., and thus a piezoelectric film 3 having a (110) preferential orientation was formed. Subsequently, a Pt film having a thickness of 200 nm was formed on the piezoelectric film 3 by sputtering at room temperature, and thus an electrode film 4 having a non-oriented structure was formed. The electrode film 4 was then bonded to a silicon support substrate 5 through an epoxy resin layer 7. The silicon substrate 1 was removed from the electrode film 8' by RIE. FIG. 4 shows the structure of the produced device.

$(Na_{0.49}K_{0.38}Li_{0.06}Sr_{0.06}Ba_{0.01})_{1.16}(Nb_{0.84}Ta_{0.10}Zr_{0.06})$
$O_3+0.5\%$ by mass of MnO The piezoelectric devices of Example 1 and Comparative Example 1 were each patterned to form a piezoelectric moving portion having a size of 1 mm×2 mm. By removing the support substrate 5, a rectangular piezoelectric device was obtained. The piezoelectric device was fixed to a stainless thin plate including wiring that uses a flexible cable. Subsequently, a voltage was applied to the pair of electrode films of the piezoelectric device to compare the displacement of the thin plate. The piezoelectric device was subjected to displacement by applying an AC voltage of 0 to 10 V at 5 kHz. The displacement was determined as a displacement per unit applied voltage by irradiating a Au film disposed on the stainless thin plate in advance with laser beams and receiving the reflected light using a laser Doppler measurement device. The device was stored in a thermo-hygrostat set at 85° C. and 85% RH for 1000 hours and the displacement was measured. The measured displacement was compared with the initial displacement.

The displacement of the piezoelectric device in Example 1 was 15.8 nm/V and the displacement of the piezoelectric device in Comparative Example 1 was 11.1 nm/V. In Table 1, an evaluation of "Good" was given for samples having a displacement of 13.5 nm/V or more and an evaluation of "Poor" was given for samples having a displacement of less than 13.5 nm/V. As in the piezoelectric device of Example 1, the piezoelectric devices of Examples 2 to 7 also had a sufficiently large displacement compared with Comparative Example 1. Table 1 shows the oxidation-reduction potentials of the piezoelectric films and the displacements in Examples 1 to 7 and Comparative Example 1.

TABLE 1

| | | | | | Oxidation-reduction potential (V) | | |
|---|---|---|---|---|---|---|---|
| | Device No. | Electrode | Intermediate film | Conductive oxide film | Electrode | Piezoelectric film | Displacement |
| Example 1 | 100A | Zn—Al | — | — | −0.78 | −0.81 | Good |
| Example 2 | 100B | Zn—Al | — | — | −0.78 | −0.81 | Good |
| Example 3 | 100C | Zn—Al | Ti | — | −0.78 | −0.81 | Good |
| Example 4 | 100C' | Zn—Al | Zr | — | −0.78 | −0.81 | Good |
| Example 5 | 100D | Zn—Al | Ti | SRO | −0.78 | −0.81 | Good |
| Example 6 | 100D' | Zn—Al | Ti | ITO | −0.78 | −0.81 | Good |
| Example 7 | 101A | Cu—Sn | — | — | 0.31 | −0.81 | Good |
| Comparative Example 1 | 110A | Zn—Al | — | — | −0.78 | −0.81 | Poor |
| Comparative Example 2 | 120A | Al | — | — | −1.68 | −0.81 | Fair*) |
| Comparative Example 3**) | 121A**) | Zn—Al | — | — | −0.78 | −0.126 | Fair*) |

*)Initial displacement OK
**)Piezoelectric film is composed of PZT

Next, the crystallinity of the piezoelectric films of the piezoelectric devices in Example 1 and Comparative Example 1 was compared. The crystallinity was measured by an X-ray diffraction method that uses ATX-E manufactured by Rigaku Corporation as a measurement apparatus and an out-of-plane method as a measurement method. The ratio of the peak strength of (110) orientation to the total intensity was measured under these conditions. The ratio of the piezoelectric device 100A in Example 1 was 92% whereas the ratio of the piezoelectric device 110A in Comparative Example 1 was 61%.

Comparative Example 2

Piezoelectric Device 120A

A piezoelectric device 120A was produced in the same manner as in Example 1, except that the material of the electrode film having a thickness of 200 nm was changed to Al.

Comparative Example 3

Piezoelectric Device 121A

A piezoelectric device 121A was produced in the same manner as in Example 1, except that the material of the piezoelectric film was changed to PZT.

Table 1 also shows the displacements of the piezoelectric devices in Comparative Examples 2 and 3. The initial displacements were sufficiently larger than that of Comparative Example 1. An evaluation of "Fair" was given in Table 1. However, when the piezoelectric devices 120A and 121A were continuously driven, the displacements were gradually decreased due to the difference in oxidation-reduction potential.

When the intermediate film 9 composed of Ti or Zr was formed between the piezoelectric film 3 and the electrode films 4 and 8 or when the conductive oxide film 10 having a non-oriented structure and composed of $SrRuO_3$ or $In_2O_3$—$SnO_2$ (ITO) was formed between the intermediate film 9 (Ti) and the piezoelectric film 3, the chemical stability of the piezoelectric film 3 was also improved and a high-reliability device was provided.

Examples 8 to 46

Piezoelectric Devices 200A to 203H

Piezoelectric devices 200A to 203H were produced in the same manner as in Example 1, except that the composition of the piezoelectric film 3 was changed to the composition shown in Table 2. The initial displacement and the displacement after a humidity test were measured. Table 2 shows the results. An evaluation of "Good" was given when the percentage of change between the initial displacement and the displacement after the humidity test was less than 5%. An evaluation of "Fair" was given when the percentage of change was 5% or more and 10% or less. An evaluation of "Poor" was given when the percentage of change was more than 10%.

TABLE 2

|  | Device No. | x | y | z | w | v | u | m | Displacement after humidity test |
|---|---|---|---|---|---|---|---|---|---|
| Example 8 | 200A | 0.39 | 0.06 | 0.10 | 0.009 | 0.06 | 0.05 | 1.16 | Fair |
| Example 9 | 201A | 0.43 | 0.07 | 0.10 | 0.010 | 0.07 | 0.07 | 1.17 | Good |
| Example 10 | 202A | 0.50 | 0.06 | 0.10 | 0.011 | 0.07 | 0.06 | 1.15 | Good |
| Example 11 | 203A | 0.70 | 0.05 | 0.11 | 0.010 | 0.07 | 0.06 | 1.15 | Good |
| Example 12 | 204A | 0.75 | 0.06 | 0.11 | 0.010 | 0.06 | 0.07 | 1.14 | Fair |
| Example 13 | 200B | 0.49 | 0.01 | 0.10 | 0.009 | 0.06 | 0.05 | 1.16 | Fair |
| Example 14 | 201B | 0.50 | 0.02 | 0.10 | 0.009 | 0.06 | 0.05 | 1.12 | Good |
| Example 15 | 202B | 0.48 | 0.05 | 0.09 | 0.011 | 0.06 | 0.06 | 1.17 | Good |
| Example 16 | 203B | 0.48 | 0.11 | 0.11 | 0.011 | 0.06 | 0.06 | 1.10 | Good |
| Example 17 | 204B | 0.49 | 0.14 | 0.11 | 0.010 | 0.06 | 0.07 | 1.16 | Fair |
| Example 18 | 200C | 0.51 | 0.05 | 0.00 | 0.010 | 0.06 | 0.06 | 1.15 | Fair |
| Example 19 | 201C | 0.50 | 0.05 | 0.02 | 0.010 | 0.07 | 0.06 | 1.12 | Good |
| Example 20 | 202C | 0.48 | 0.05 | 0.11 | 0.011 | 0.06 | 0.07 | 1.17 | Good |
| Example 21 | 203C | 0.49 | 0.05 | 0.28 | 0.009 | 0.07 | 0.05 | 1.18 | Good |
| Example 22 | 204C | 0.50 | 0.04 | 0.33 | 0.009 | 0.06 | 0.05 | 1.15 | Good |
| Example 23 | 200D | 0.49 | 0.07 | 0.11 | 0.00 | 0.07 | 0.07 | 1.15 | Fair |
| Example 24 | 201D | 0.48 | 0.05 | 0.09 | 0.003 | 0.06 | 0.05 | 1.18 | Good |
| Example 25 | 202D | 0.49 | 0.05 | 0.10 | 0.01 | 0.06 | 0.05 | 1.14 | Good |
| Example 26 | 203D | 0.50 | 0.06 | 0.10 | 0.02 | 0.06 | 0.06 | 1.17 | Good |
| Example 27 | 204D | 0.48 | 0.06 | 0.10 | 0.03 | 0.05 | 0.06 | 1.15 | Fair |
| Example 28 | 200E | 0.51 | 0.06 | 0.10 | 0.009 | 0.01 | 0.06 | 1.15 | Fair |
| Example 29 | 201E | 0.49 | 0.07 | 0.10 | 0.009 | 0.02 | 0.07 | 1.14 | Good |
| Example 30 | 202E | 0.49 | 0.06 | 0.10 | 0.011 | 0.07 | 0.05 | 1.16 | Good |
| Example 31 | 203E | 0.48 | 0.05 | 0.09 | 0.011 | 0.11 | 0.05 | 1.12 | Good |
| Example 32 | 204E | 0.49 | 0.05 | 0.11 | 0.010 | 0.12 | 0.06 | 1.17 | Fair |
| Example 33 | 200F | 0.49 | 0.06 | 0.10 | 0.010 | 0.06 | 0.01 | 1.18 | Fair |
| Example 34 | 201F | 0.48 | 0.06 | 0.10 | 0.010 | 0.06 | 0.02 | 1.15 | Good |
| Example 35 | 202F | 0.49 | 0.06 | 0.10 | 0.011 | 0.06 | 0.07 | 1.15 | Good |
| Example 36 | 203F | 0.50 | 0.07 | 0.11 | 0.009 | 0.07 | 0.11 | 1.18 | Good |
| Example 37 | 204F | 0.48 | 0.06 | 0.10 | 0.009 | 0.06 | 0.12 | 1.14 | Fair |
| Example 38 | 200G | 0.51 | 0.05 | 0.10 | 0.010 | 0.06 | 0.05 | 0.93 | Fair |
| Example 39 | 201G | 0.49 | 0.06 | 0.11 | 0.009 | 0.06 | 0.05 | 0.95 | Good |
| Example 40 | 202G | 0.49 | 0.06 | 0.11 | 0.010 | 0.07 | 0.06 | 1.16 | Good |
| Example 41 | 203G | 0.48 | 0.07 | 0.10 | 0.011 | 0.06 | 0.06 | 1.20 | Good |
| Example 42 | 204G | 0.49 | 0.08 | 0.10 | 0.010 | 0.07 | 0.07 | 1.25 | Fair |
| Example 43 | 200H | 0.50 | 0.05 | 0.09 | 0.010 | 0.06 | 0.06 | 1.16 | Good |
| Example 44 | 201H | 0.48 | 0.06 | 0.11 | 0.009 | 0.06 | 0.06 | 1.12 | Good |
| Example 45 | 202H | 0.48 | 0.05 | 0.11 | 0.011 | 0.06 | 0.07 | 1.17 | Good |
| Example 46 | 203H | 0.48 | 0.06 | 0.09 | 0.009 | 0.07 | 0.05 | 1.16 | Fair |

As is clear from Examples 8 to 46 in Table 2, a piezoelectric device having high moisture resistance and a sufficiently large displacement can be provided by satisfying the composition represented by formula (1) below. The piezoelectric film has a composition represented by formula (1) below and contains 1% by mass or less of MnO relative to the composition.

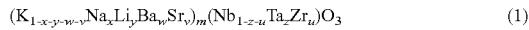

$$(K_{1-x-y-w-v}Na_xLi_yBa_wSr_v)_m(Nb_{1-z-u}Ta_zZr_u)O_3 \qquad (1)$$

In formula (1), x, y, z, w, v, u, and m satisfy $0.4 < x \leq 0.7$, $0.02 \leq y \leq 0.11$, $0.5 \leq x+y < 0.75$, $0 < z \leq 0.28$, $0 < w \leq 0.02$, $0.02 \leq v \leq 0.11$, $0.02 \leq u \leq 0.11$, and $0.95 \leq m < 1.2$.

What is claimed is:

1. A piezoelectric device comprising:
a first electrode film;
a piezoelectric film disposed on the first electrode film; and
a second electrode film disposed on the piezoelectric film,
wherein an oxidation-reduction potential of a metal element constituting the first and second electrode films is higher than oxidation-reduction potentials of all metal elements constituting the piezoelectric film, and
the piezoelectric film has a composition represented by formula (1) below and contains 1% by mass or less of MnO relative to the composition

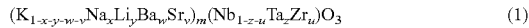

$$(K_{1-x-y-w-v}Na_xLi_yBa_wSr_v)_m(Nb_{1-z-u}Ta_zZr_u)O_3 \qquad (1)$$

where x, y, z, w, v, u, and m in formula (1) satisfy $0.4 < x \leq 0.7$, $0.02 \leq y \leq 0.11$, $0.5 \leq x+y < 0.75$, $0 < z \leq 0.28$, $0 < w \leq 0.02$, $0.02 \leq v \leq 0.11$, $0.02 \leq u \leq 0.11$, and $0.95 \leq m < 1.2$.

2. The piezoelectric device according to claim 1, wherein the piezoelectric film has a preferentially oriented structure.

3. The piezoelectric device according to claim 1, wherein the piezoelectric film has a tetragonal structure as a main phase in a room temperature range.

4. The piezoelectric device according to claim 1, wherein at least one of the first and second electrode films is composed of an alloy, and a main component of the alloy is a metal selected from the group consisting of Zn, Fe, Co, Ni, and Cu.

5. The piezoelectric device according to claim 1, wherein the first and second electrode films have a non-oriented or amorphous structure.

6. The piezoelectric device according to claim 1, further comprising an intermediate film composed of an element selected from Al, Ti, Zr, Ta, Cr, Co, and Ni and disposed between the piezoelectric film and at least one of the first and second electrode films.

7. The piezoelectric device according to claim 1, further comprising a conductive oxide film disposed between the piezoelectric film and at least one of the first and second electrode films.

8. The piezoelectric device according to claim 2, wherein the piezoelectric film has a tetragonal structure as a main phase in a room temperature range.

* * * * *